(12) United States Patent
Igarashi et al.

(10) Patent No.: US 8,210,701 B2
(45) Date of Patent: Jul. 3, 2012

(54) LIGHTING DEVICE AND DISPLAY DEVICE HAVING THE SAME

(75) Inventors: Takahiro Igarashi, Kanagawa (JP); Takamasa Izawa, Kanagawa (JP); Tsuneo Kusunoki, Kanagawa (JP)

(73) Assignee: Sony Corporation, Tokyo (JP)

( * ) Notice: Subject to any disclaimer, the term of this patent is extended or adjusted under 35 U.S.C. 154(b) by 455 days.

(21) Appl. No.: 12/576,000

(22) Filed: Oct. 8, 2009

(65) Prior Publication Data

US 2010/0085727 A1    Apr. 8, 2010

(30) Foreign Application Priority Data

Oct. 8, 2008  (JP) ................................. P2008-261285

(51) Int. Cl.
*G09F 13/04* (2006.01)

(52) U.S. Cl. ............. 362/97.1; 362/97.3; 362/97.4; 362/84; 362/231; 362/311.03; 257/98; 257/100

(58) Field of Classification Search ............. 362/97.1, 362/97.3, 84, 231, 311.2; 257/98, 100; 313/498, 313/502, 504
See application file for complete search history.

(56) References Cited

U.S. PATENT DOCUMENTS

| | | | |
|---|---|---|---|
| 6,234,648 B1 | 5/2001 | Borner et al. | |
| 6,517,213 B1 | 2/2003 | Fujita et al. | |
| 7,762,692 B2* | 7/2010 | Lai et al. | 362/311.02 |
| 7,810,947 B2* | 10/2010 | Ueno et al. | 362/231 |
| 7,959,321 B2* | 6/2011 | Ryu et al. | 362/231 |
| 2006/0002146 A1* | 1/2006 | Baba | 362/613 |
| 2007/0215890 A1 | 9/2007 | Harbers et al. | |
| 2010/0102707 A1* | 4/2010 | Fukuda et al. | 313/503 |

FOREIGN PATENT DOCUMENTS

| | | |
|---|---|---|
| JP | 11-249604 | 9/1999 |
| JP | 2003-529889 | 10/2003 |
| JP | 2004-161808 | 6/2004 |
| JP | 2005-72479 | 3/2005 |
| JP | 2005-77448 | 3/2005 |
| JP | 2006-126109 | 5/2006 |
| JP | 2007-4099 | 1/2007 |
| JP | 2007-85797 | 4/2007 |
| JP | 2007-273998 | 10/2007 |
| JP | 2008-50593 | 3/2008 |
| JP | 2008-117879 | 5/2008 |

* cited by examiner

*Primary Examiner* — Ali Alavi
(74) *Attorney, Agent, or Firm* — K&L Gates LLP

(57) ABSTRACT

Disclosed herein is a lighting device including a blue light-emitting element adapted to emit a blue light beam; and a green phosphor layer which is disposed apart from the blue light-emitting element and can function as a light diffusion layer, the green phosphor layer including a green phosphor adapted to emit green fluorescence when excited by the blue light beam, the green phosphor having a refractive index of 1.49 or more and a quantum efficiency of 79% or more.

10 Claims, 9 Drawing Sheets

PORTION a    PORTION b

LIGHTING DEVICE AND DISPLAY DEVICE HAVING THE SAME

CROSS REFERENCES TO RELATED APPLICATIONS

The present application claims priority to in Japanese Priority Patent Application JP 2008-261285 filed in the Japan Patent Office on Oct. 8, 2008, the entire content of which is hereby incorporated by reference.

BACKGROUND

The present application relates to a lighting device having a blue light-emitting element and green phosphor layer, and more particularly to a lighting device which is used in a display device such as liquid crystal television set thanks to its high reliability even if an arbitrary green phosphor is used.

Recent years have seen a brisk development of backlights for liquid crystal television sets. Backlight schemes can be broadly classified into two types: (1) white LED (light-emitting diode) obtained by potting a blue LED with transparent resin having a yellow or green phosphor adapted to emit a blue light beam and red phosphor dispersed therein and (2) tricolor LED using blue, green and red LEDs.

The white LED classified as type (1) is characterized in that a simple driver system can be achieved because a backlight can be formed by driving the blue LED element adapted to emit a blue light beam. The tricolor LED classified as type (2) is characterized in that a liquid crystal television set having excellent color purity can be provided thanks to narrow emission spectral line widths from the LEDs emitting blue, green and red light beams. With type (1), however, the wavelength of light emission from the red phosphor has to be lengthened to achieve a wide color range. However, lengthening the light emission leads to significantly reduced brightness. On the other hand, type (2) is problematic due to its low efficiency of white light attributable to low efficiency of the green LED.

The following mention is made in Japanese Patent Laid-Open No. Hei 11-249604 (paragraph 0019, paragraphs 0033 to 0083, paragraphs 0091 to 0093, FIGS. 4 and 5) which is titled "Surface-Illuminated Display Device."

The surface-illuminated display device performs display by illuminating a given display surface and includes a (a) light source having a first light-emitting substance adapted to emit a light beam of a first wavelength and a second light-emitting substance adapted to emit a light beam of a wavelength different from the first wavelength and (b) fluorescent plate having incident and emitting surfaces. The incident surface receives a light beam from the light source. The emitting surface faces the display surface. The fluorescent plate converts part of the light beam of the first wavelength into a light beam of the second wavelength longer than the first wavelength.

The following mention is made in Japanese Patent Laid-Open No. 2005-72479 (paragraphs 0021 to 0022, paragraphs 0056 to 0058, FIG. 9) which is titled "White Light-Emitting Device."

The white light-emitting device may include two LEDs. One of the two LEDs includes, as a phosphor $ZnS_xSe_{1-x}$ ($0<x<1$), at least one of phosphor $ZnS_xSe_{1-x}$ ($0.7 \leq x \leq 0.9$) containing at least Au or Cu as an activator and phosphor $ZnS_xSe_{1-x}$ ($0.5 \leq x \leq 0.8$) containing Ag as an activator, and emits a light beam having a wavelength in the range from 410 nm to 490 nm. Another LED emits a red light beam.

In this configuration, one of the phosphors takes charge of green (G), thus allowing for the blue and red LEDs to form an RGB white light-emitting element. Therefore, the document claims that it is possible to produce a white light beam which is applicable, without any problem, to all applications including red light beam.

The following mention is made in Japanese Patent Laid-Open No. 2007-273998 (paragraph 0014, paragraphs 0022 to 0023, FIG. 2) which is titled "White LED for Backlight Having a Phosphor Plate."

The document claims that the white LED adapted to backlight the LCD (liquid crystal display) includes a blue LED added with preformed red and green phosphor platelets.

The following mention is made in Japanese Patent Laid-Open No. 2007-4099 (paragraphs 0014 to 0015, paragraphs 0055 to 0064, paragraph 0071, paragraphs 0078 to 0085, FIGS. 2 and 3) (hereinafter referred to as Patent Document 1) which is titled "Surface Light Source Device and Color Liquid Crystal Display Device Assembly."

A surface light source device according to a first embodiment in Patent Document 1 is a surface light source device (more particularly a direct-type surface light source device) for lighting a transmissive color liquid crystal display device from the rear panel side. The liquid crystal display device includes a (a) front panel having a first transparent electrode, (b) rear panel having a second transparent electrode, (c) liquid crystal material provided between the front and rear panels. The surface light source device includes a (A) light source, (B) supporting member, (C) second primary color light-emitting layer and (D) third primary color light-emitting layer. The light source is arranged to be opposed to the rear panel and emits a first primary color light beam associated with a first primary color of the three primary colors of light which include first to third primary colors. The supporting member is provided between the rear panel and light source. The second primary color light-emitting layer is formed on the region of the supporting member associated with a subpixel adapted to emit a second primary color light beam corresponding to a second primary color of the color liquid crystal display device. The second primary color light-emitting layer includes second primary color light-emitting particles adapted to emit the second primary color light beam. The second primary color light-emitting layer is excited by energy radiation from the light source to emit the second primary color light beam. The third primary color light-emitting layer is formed on the region of the supporting member associated with a subpixel adapted to emit a third primary color light beam corresponding to a third primary color of the color liquid crystal display device. The third primary color light-emitting layer includes third primary color light-emitting particles adapted to emit the third primary color light beam. The third primary color light-emitting layer is excited by energy radiation from the light source to emit the third primary color light beam.

The following mention is made in Japanese Patent Laid-Open No. 2008-117879 (paragraph 0010, paragraphs 0032 to 0033, FIG. 5) (hereinafter referred to as Patent Document 2) which is titled "Planar Light-Emitting Device."

This provides a planar light-emitting device. The planar light-emitting device includes a diffusion plate, first light-emitting elements and wavelength conversion sheet. The diffusion plate has main and rear surfaces, evens out the intensity distribution of the incident light beam entering from the rear surface and emits a light beam having a uniform intensity distribution. The first light-emitting elements are arranged on the side of the rear surface of the diffusion plate in a two-dimensional manner and each emit a blue light beam. The wavelength conversion sheet is provided on the side of the main or rear surface of the diffusion plate and includes a wavelength conversion material adapted to absorb the light beams from the first light-emitting elements and emit a green light beam.

Figure 9:
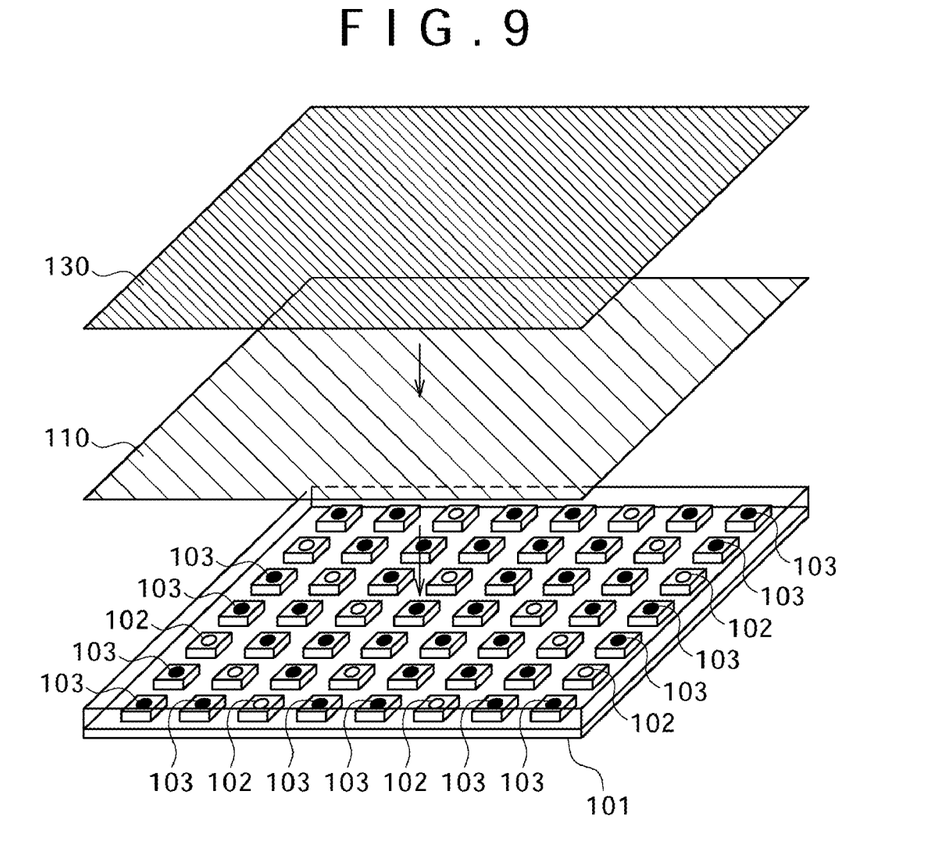
FIG. 9 is a view describing a planar light-emitting device according to the related art.

FIG. 9 is FIG. 5 shown in Patent Document 2 and a schematic perspective view of a planar light-emitting device according to a third embodiment disclosed in Patent Document 2.

In this specific example, red and blue light-emitting elements 102 and 103 are arranged in a two-dimensional manner on a substrate 101 on the side of a rear surface of a diffusion plate 110 having main and rear surfaces. Either a space or a ight-transmitting material such as resin may be provided between the light-emitting elements 102 and 103 and diffusion plate 110.

Also in this case, the red and blue light-emitting elements 102 and 103 can be provided on the substrate roughly at a ratio of 1:2. In the present embodiment, a low efficiency green light-emitting element is also omitted. Instead, a wavelength conversion sheet 130 is provided on the surface of the diffusion plate 110. The wavelength conversion sheet 130 includes a green wavelength conversion material which matches the LCD color filter. Patent Document 2 claims that the third embodiment provides reduced overall cost and prevents efficiency deterioration thanks to the omission of the low efficiency green LED as with the first and second embodiments.

The following mention is made in JP-T-2003-529889 (paragraph 0012, paragraphs 0021 to 0022, FIG. 1) (hereinafter referred to as Patent Document 3) which is titled "Lighting Device."

An extremely excellent embodiment of a lighting device according to a first concept disclosed in Patent Document 3 is characterized in that at least two light-emitting diodes include a blue light-emitting diode and at least one red light-emitting diode and that the conversion means include a luminescent material adapted to convert part of the light beam from the blue light-emitting diode into a green light beam.

It should be noted that descriptions about a phosphor sheet are given, for example, in Japanese Patent Laid-Open No. 2004-161808 (paragraphs 0067 to 0068, FIG. 1), Japanese Patent Laid-Open No. 2005-77448 (paragraph 0068) (hereinafter referred to as Patent Document 4), Japanese Patent Laid-Open No. 2006-126109 (paragraph 0157), Japanese Patent Laid-Open No. 2007-85797 (paragraphs 0065 to 0070, paragraphs 0077 to 0078), and Japanese Patent Laid-Open No. 2008-50593 (paragraphs 0006 to 0010, paragraph 0066, paragraphs 0085 to 0086, FIG. 3)

SUMMARY

When a lighting device is manufactured using a phosphor together with an LED, a phosphor kneaded with resin is potted directly on a blue LED chip. In manufacturing a lighting device such as backlight, there is strong desire for a high performance backlight using the highest performance blue LED and phosphor available (in terms of emission efficiency and color purity). When a lighting device is manufactured using a blue LED chip and phosphor, the reliability and efficiency of the lighting device depends significantly on factors including the configuration and structure of the blue LED chip, phosphor type and packaging structure.

Green phosphors adapted to emit a blue light beam can be broadly classified into oxides, sulfides, nitrides and oxynitrides. Although there is no report that nitride green phosphors and oxynitride green phosphors have a high efficiency, oxynitrides and nitrides are generally highly reliable. When a lighting device (white LED) combining a blue LED and phosphor is used as a backlight of a liquid crystal device, any type of phosphor should preferably be usable from the viewpoint of productivity, cost, performance and so on. Further, the phosphor should preferably have a high quantum efficiency.

For example, a phosphor obtained by adding Cu and Al to ZnS and another obtained by adding Eu and Mn to $(Ba.Mg)Al_{11}O_{17}$, disclosed in Patent Document 2, are originally designed for use in CRTs and lamps, respectively. These phosphors are excited by electron radiation and a light beam having a wavelength of 253.7 nm. The internal quantum efficiencies of the above phosphors by blue light excitation (450 nm) were measured by the inventors of the present invention to be 51% and 42%, respectively. The internal quantum efficiency of a YAG phosphor, widely used today for white LEDs, is 79%. As a result, it can be determined that these phosphors have low quantum efficiencies. As described above, the above phosphors are not fit for practical application as phosphors in a lighting device (white LED) combining a blue LED and phosphor because of their low internal quantum efficiencies.

A phosphor can be used despite its low quantum efficiency if a large number of LEDs are used and large electric power is supplied. However, poorly reliable phosphor materials such as those containing a sulfur atom may not be used unless some measure is taken against poor reliability. Further, a phosphor with low quantum efficiency may not find application in today's electric appliances which has to be ecologically friendly.

A white LED often includes an LED embedded with an organic resin in which a phosphor is dispersed. However, the organic resin may deteriorate under the influence of outside atmosphere such as moisture. Further, the phosphor may deteriorate depending on its type, changing the quantum efficiency thereof and shortening the life of the white LED. For this reason, a white LED may include a combination of a wavelength conversion member and blue LED. The wavelength conversion member is formed by dispersing a phosphor in glass. However, the wavelength conversion member requires high temperature treatment during its formation. This may thermally deteriorate the phosphor. As a result, this method is not applicable to a wide variety of arbitrary phosphors.

An optical sheet called diffusion sheet adapted to uniformly diffuse light is used in liquid crystal televisions. For example, this diffusion sheet has an optical PET film coated with resin or inorganic bead as a light diffusion agent as disclosed in Patent Document 4. The higher the refractive index, the higher the light diffusion capability. Therefore, a light diffusion agent with a high refractive index should preferably be used. However, Patent Document 4 takes no account of the refractive index of the light diffusion agent.

The embodiment of the present application has been made in light of the foregoing, and it is an aim of the embodiment of the present invention to provide a highly reliable and highly efficient lighting device, irrespective of the configuration and structure of the blue LED chip and phosphor type, and a display device having the same.

That is, the embodiment of the present application relates to a lighting device. The lighting device includes a blue light-emitting element (e.g., blue LED 50B in an embodiment described later) adapted to emit a blue light beam. The lighting device further includes a green phosphor layer (e.g., green phosphor sheet 53 in the embodiment described later) which is disposed apart from the blue light-emitting element and can function as a light diffusion layer. The green phosphor layer includes a green phosphor. The green phosphor emits green fluorescence when excited by the blue light beam. The green phosphor has a refractive index of 1.49 or more and a quantum efficiency of 79% or more.

An embodiment of the present application also relates to a display device having the lighting device as a backlight.

A lighting device according to an embodiment includes a blue light-emitting element adapted to emit a blue light beam. The lighting device further includes a green phosphor layer. The green phosphor layer is disposed apart from the blue light-emitting element and can function as a light diffusion layer. The green phosphor layer includes a green phosphor adapted to emit green fluorescence when excited by the blue light beam. The green phosphor has a refractive index of 1.49 or more and a quantum efficiency of 79% or more. Therefore, the embodiment of the present invention provides a highly reliable and highly efficient lighting device, irrespective of the configuration and structure of the blue light-emitting element and the type of the green phosphor, even if a blue light-emitting element having an arbitrary structure and an arbitrary green phosphor are used.

An embodiment also provides a highly reliable and highly efficient display device having the lighting device as a backlight.

Additional features and advantages are described herein, and will be apparent from the following Detailed Description and the figures.

DETAILED DESCRIPTION

The present application will be described below in greater detail with reference to the drawings according to an embodiment.

In the lighting device according to an embodiment, the green phosphor layer should preferably be formed on a transparent support plate or light diffusion plate. Such a configuration allows for the formation of the green phosphor layer on the surface of a transparent support plate or light diffusion plate by an ordinary method and permits the green phosphor layer to function as a light diffusion layer. The formation of the green phosphor layer on a light diffusion plate ensures more preferred light diffusion.

Further, the lighting device should preferably include a red light-emitting element adapted to emit a red light beam. The red light-emitting element should preferably be arranged side by side with the blue light-emitting element so that the blue, green and red light beams are mixed together to emit a white light beam. Such a configuration provides a highly efficient lighting device for emitting a white light beam.

Still further, the green phosphor layer should preferably be provided above the blue light-emitting element. Such a configuration makes it possible to provide the green phosphor layer above and in proximity to the blue light-emitting element, thus ensuring enhanced excitation efficiency of the green phosphor layer with the blue light beam.

Still further, the blue and red light-emitting elements should preferably be LEDs. Such a configuration provides a highly reliable, long-life and highly efficient lighting device for emitting a white light beam.

Still further, the green phosphor should preferably be composed of $SrGa_2S_4$:Eu or $(Sr,Ba)_2SiO_4$. The internal quantum efficiencies of $SrGa_2S_4$:Eu and $(Sr,Ba)_2SiO_4$ are respectively 86% and 81% which are higher than that of a YAG phosphor of 79%. Such a configuration provides a highly reliable and highly efficient lighting device.

In the display device according to the embodiment of the present invention, the green phosphor layer should preferably be provided on the light emission side of the backlight or light incident side of a display panel. Such a configuration provides a higher degree of freedom in designing the device.

Still further, the display panel should preferably be a liquid crystal panel. Such a configuration makes a liquid crystal display device having the liquid crystal panel suitable for use as the display device of a television and PC.

Still further, the display device should preferably have a pixel section which turns on and off synchronously with the lighting and extinguishing of the backlight. Black image data is inserted in part of a frame (region in which black image data is inserted is referred to as the "black insertion region"). The blue and red light-emitting elements located at the positions associated with the black insertion region are turned off synchronously with the movement of the black insertion region when the black image is displayed. That is, the blue and red light-emitting elements located at the positions associated with the region other than the black insertion region are turned on, whereas those located at the positions associated with the black insertion region are turned off. Such a configuration contributes to improved moving image characteristics and color quality, thus providing a display device capable of fast moving image display.

The green phosphor layer making up the lighting device according to the embodiment of the present invention emits a green light beam when excited by a blue light beam. The same layer is formed with a phosphor having a refractive index of 1.49 or more, and preferably 2 or more. The same layer functions as a light diffusion layer adapted to produce a diffused light beam by diffusing a blue light beam, i.e., excitation light, and a green light beam produced by excitation with the blue light beam. The higher the internal quantum efficiency of the green phosphor layer resulting from blue light excitation, the better. For example, the green phosphor layer should preferably have an internal quantum efficiency higher than that of a YAG phosphor or 79% from the viewpoint of emission efficiency.

The green phosphor layer is provided, for example, at a distance from the light source such as an LED adapted to emit a blue light beam so as not to be in direct contact therewith, thus diffusing the light beams from the light source and phosphor layer. This provides a highly reliable and highly efficient lighting device irrespective of the light source structure and phosphor type.

$SrGa_2S_4$:Eu or $(Sr,Ba)_2SiO_4$ can be, for example, used as the green phosphor. However, irrespective of the phosphor type, the embodiment of the present invention provides a lighting device using a blue LED chip of arbitrary structure as an excitation source. Such a lighting device offers high reliability and high efficiency, making it suitable for use as a backlight of a liquid crystal display device.

A detailed description will be given below of a preferred embodiment of the present invention with reference to the accompanying drawings according to an embodiment.

Schematic Configuration of the Lighting Device

Figure 1A:
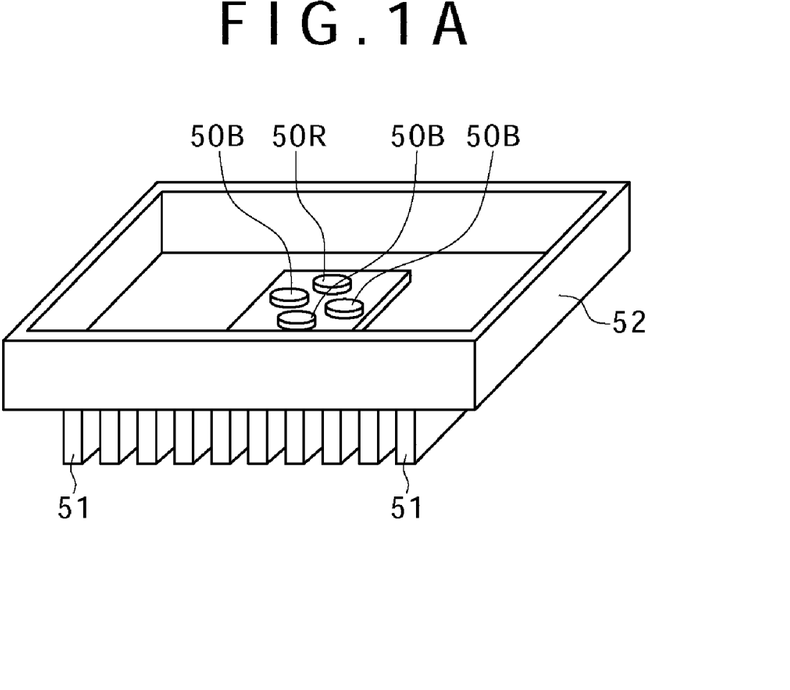
FIGS. 1A and 1B are perspective views describing the schematic configuration of a lighting device according to an embodiment.
Figure 1B:
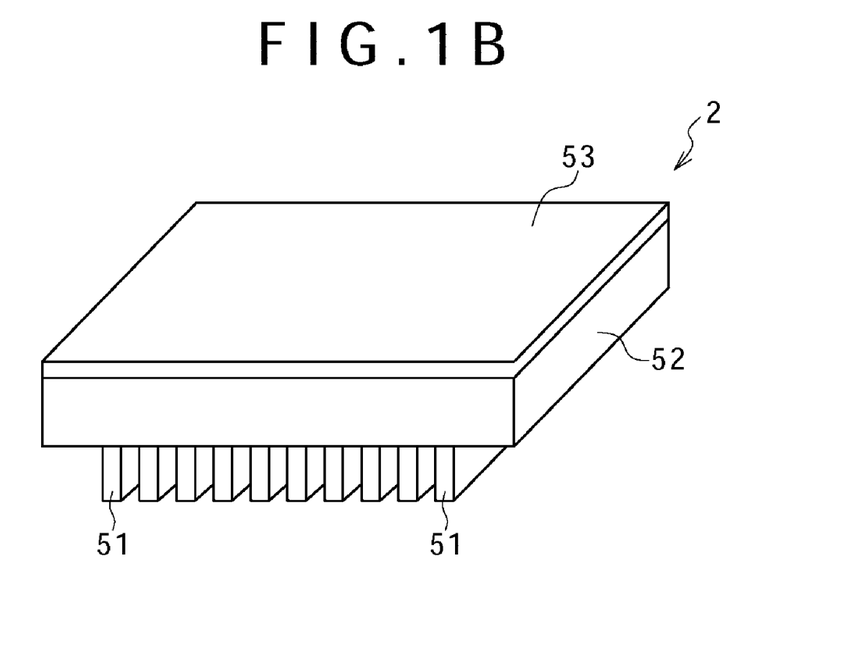

FIGS. 1A and 1B are perspective views describing the schematic configuration of a lighting device according to the embodiment of the present application.

FIG. 1A is a perspective view illustrating the internal schematic configuration of the lighting device. FIG. 1B is a perspective view illustrating the appearance of the lighting device.

As illustrated in FIGS. 1A and 1B, a lighting device 2 includes a plurality of light-emitting elements arranged on the inner bottom surface of a light source enclosure 52 having a light-reflecting inner surface. The lighting device 2 further includes heatsinks 51 which are in thermal contact with the light source enclosure 52. The lighting device 2 still further includes a green phosphor layer 53 which makes up a lid section of the light source enclosure 52.

The light-emitting elements include, for example, blue LEDs 50B and a red LED 50R. The green phosphor layer 53 makes up the lid section and, at the same time, acts as a light-emitting source adapted to emit a green light beam when excited by the blue LEDs 50B and as a light diffusion layer. A variety of types of LEDs can be used as the blue LEDs 50B and red LED 50R.

It should be noted that, in FIGS. 1A and 1B, the LED drive circuitry and wirings connected thereto are omitted for the sake of simplification and that only the three blue LEDs 50B and one red LED 50R are shown. The two blue LEDs 50B and one red LED 50R may be combined as a set and arranged in a one- or two-dimensional manner. The number of LEDs making up the lighting device and the arrangement thereof are not limited to those shown in the example of FIG. 1.

The green phosphor sheet 53 can be manufactured by a publicly known method. In order to manufacture the same sheet 53, for example, green phosphor particles are dispersed in an organic resin dissolved in a solvent. Then, the solution is applied to a thin transparent substrate made of an organic or inorganic material by a publicly known coating method to form a green phosphor layer. Finally, the solvent is volatilized to harden the resin, thus manufacturing the green phosphor layer. $SrGa_2S_4$:Eu or $(Sr,Ba)_2SiO_4$ can be, for example, used as the green phosphor.

It should be noted that the green phosphor layer may include particles made of a light-diffusing organic or inorganic material in addition to green phosphor particles.

A description will be given next of desirable characteristics of the green phosphor used in the present embodiment.

Desirable Characteristics of the Green Phosphor

The internal quantum efficiency of a YAG phosphor, the most famous phosphor for use in combination with blue LEDs, was measured at the time of formation of a white LED to be 79%. White LEDs using this YAG phosphor have already been commercialized. Therefore, it can be determined that the white LED whose phosphor is excited by blue LEDs is fit for practical use so long as the quantum efficiency of the phosphor used to form the white LED is 79% or more.

The measured internal quantum efficiencies of $SrGa_2S_4$:Eu and $(Sr,Ba)_2SiO_4$ (whose composition is $(Sr_{0.97}Ba_{0.97})SiO_4$:$Eu_{0.06}$) are 86% and 81%, respectively. Thanks to measured efficiencies higher than 79%, the green phosphor provides a highly reliable and highly efficient lighting device fit for practical use when used in combination with blue LEDs.

It should be noted that the internal quantum efficiency of a phosphor is defined as the ratio of the number of photons that are emitted (that emit light) from the phosphor to the number of photons of excitation light absorbed by the phosphor. To measure the internal quantum efficiencies, a measurement cell was filled with phosphor powder to provide a smooth surface first. Next, the measurement cell was placed in position on an integrating sphere. Finally, the internal quantum efficiencies were measured using a FP-6500 type fluorescence spectrophotometer (by JASCO).

Because a phosphor is in particle form, it scatters light. Therefore, phosphor particles act also as a light diffusion agent. In order for a light diffusion agent to offer high light diffusion capability, it is probable that the agent should have a high refractive index. The refractive index (n) of an acrylic resin (polymethyl methacrylate or PMMA) used as a light diffusion agent is 1.49. It is probable that a phosphor should function properly as a light diffusion agent so long as the refractive index (n) thereof is equal to or greater than 1.49. The green phosphor used in the present embodiment has a refractive index (n) of 1.49 or more, and preferably 2 or more.

The phosphor is, for example, sulfide phosphor $SrGa_2S_4$:Eu or phosphor $(Sr,Ba)_2SiO_4$:Eu (whose composition is $(Sr_{0.97}Ba_{0.97})SiO_4$:$Eu_{0.06}$). The measured refractive indices (n) of these phosphors are 2.28 and 1.628, respectively. It should be noted that these refractive indices were measured by the immersion method (Becke line method) in which immersed phosphor particles are observed under microscope.

The sulfide phosphor $SrGa_2S_4$:Eu and phosphor $(Sr,Ba)_2SiO_4$:Eu offer a quantum efficiency of 80% or more when excited with blue light. Moreover, these phosphors offer a refractive index of 1.49 or more, making them excellent both as phosphors and light diffusion agents capable of diffusing light. If the lighting device (light-emitting device) has its phosphor layer, containing one of these phosphors, provided at a distance from the light source such as blue LEDs so as not to be in direct contact therewith so that the light beams from the light source and phosphor layer are diffused, it is possible to provide a highly reliable and highly efficient lighting device irrespective of the phosphor type.

An outline will be given next of the green phosphor sheet 53.

Transparent Substrate

Plastic films with high light transmittance and glass are among materials used as a transparent substrate which functions as a support to hold the green phosphor layer. Films such as polyester, polycarbonate, polyethylene, polypropylene, triacetyl cellulose and polyvinyl chloride films can be used.

Resin Adapted to Disperse Phosphor

This resin is a binder resin excellent in optical transparency adapted to disperse the green phosphor. For example, polyester-, urethane-, acryl-, polycarbonate-, epoxy-, polypropylene-, silicone- and fluorine-based resins can be used.

Phosphor

It should be noted that a green inorganic phosphor having an emission color in the green to orange region is applicable as a phosphor used in the phosphor sheet shown in FIGS. 1A and 1B.

Among phosphors that can be used as a green inorganic phosphor are rare earth aluminate-based phosphors having a garnet structure, alkali earth metal aluminate phosphors, alkali earth metal silicate phosphors, alkali earth metal silicon oxynitride phosphors and alkali earth metal gallium sulfide phosphors. These phosphors are at least activated by Eu or Ce. Selection of a green phosphor type for use makes it possible to produce a white light beam with desired color purity from the lighting device. Further, a plurality of green phosphors of different types can be mixed together to produce a white light beam with desired color purity from the lighting device.

More specifically, the following are among phosphors that can be used as a green inorganic phosphor, namely, $SrGa_2S_4$:Eu, $(Sr,Ca,Ba)(Al,Ga)_2S_4$:Eu, $(Ca,Sr,Ba)Ga_2S_4$:Eu, $BaAl_2O_4$:Eu, $SrAl_2O_4$:Eu, $(Ba,Sr)Al_2O_4$:Eu, $CaAl_2O_4$:Eu, $Sr_4Al_4O_{25}$:Eu, $Ba_2SiO_4$:Eu, $(Sr,Ba,Mg)_2SiO_4$:Eu, $(Ba,Sr)_2SiO_4$:Eu, $Ba_2MgSi_2O_7$:Eu, $Ca_{3(1-x)}Mg_3Si_4O_{28}$:Eu$_x$, $Ba_2(Mg,Zn)Si_2O_7$:Eu, $BaSi_2O_2N_2$:Eu, $(Sr,Ca)Si_2O_2N_2$:Eu, β-SiAlON:Eu, $Lu_3Al_5O_{12}$:Ce, $Y_3Al_5O_{12}$:Ce, $Y_3(Al,Ga)_5O_{12}$:Ce, $(Y,Gd)_3Al_5O_{12}$:Ce, $Y_3(Al,Ga)_5O_{12}$:Ce and $Ca_3Sc_2Si_3O_{12}$:Ce.

The phosphor layer should preferably have high light diffusion capability and light transmitting capability to function properly as a light diffusion layer. Therefore, the diameter of the phosphor particles used to form the phosphor layer has to be equal to or greater than the emission wavelength of the green light beam. Because the wavelength in the green range is 0.5 μm or more, the particle diameter have to be 0.5 μm or more. Further, in order for a light beam from the light source to enter the diffusion layer and be efficiently diffused by the phosphor, the phosphor has to at least have a refractive index greater than that of the binder resin. Letting the refractive index of the binder resin used to form the phosphor layer be denoted by $n_R$ and the refractive index of the phosphor by $n_F$, the ratio between the two refractive indices should preferably be $1 \leq (n_F/n_R)$. On the other hand, the thickness of the phosphor layer and the amounts of different phosphors mixed together vary depending on the white chromaticity of the liquid crystal television set and may not be indiscriminately specified.

The lighting device according to the embodiment is applicable to general lighting including ceiling lighting fixtures and a variety of other applications.

The lighting device described in FIGS. 1A and 1B can be used, for example, as a backlight of a display device such as liquid crystal television set, and can be used, for example, suitably as a backlight of a display device such as liquid crystal television set adapted to display fast moving images.

A description will be given next of a display device using the lighting device according to the embodiment of the present invention as its backlight.

Liquid Crystal Display Device Using Direct-Type Backlight

Figure 2:
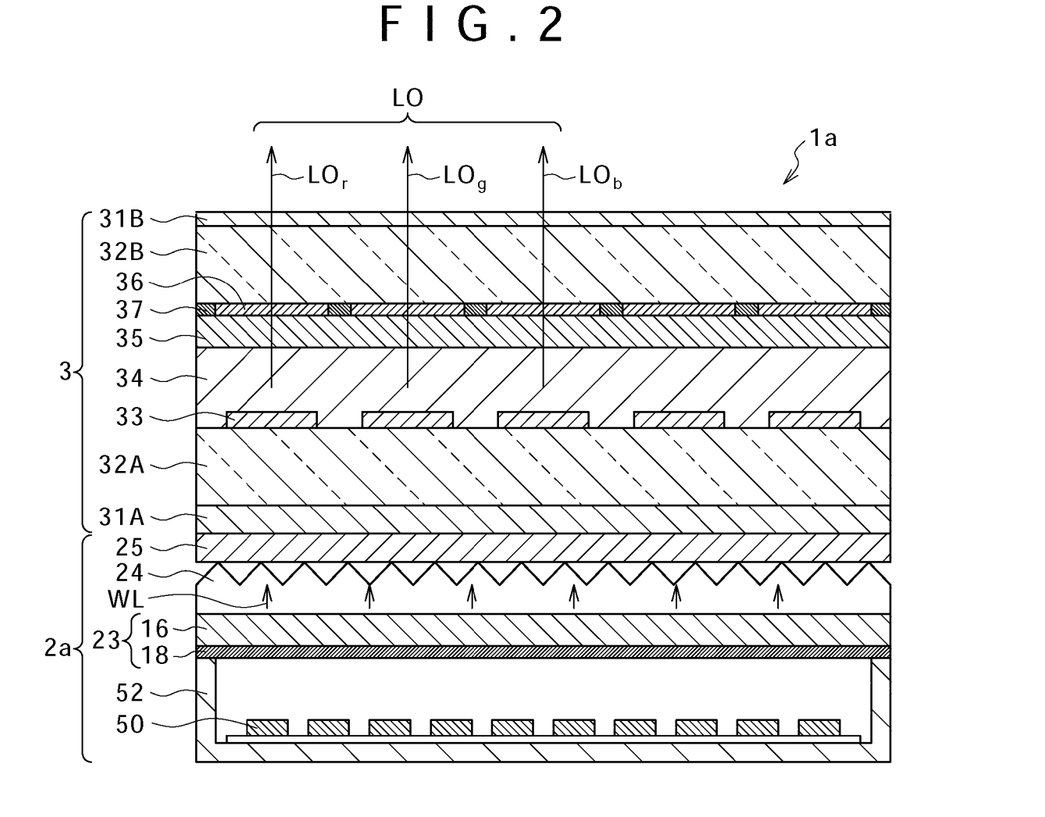
FIG. 2 is a cross-sectional view describing the schematic configuration of a liquid crystal display device using a direct-type backlight according to an embodiment.

FIG. 2 is a cross-sectional view describing the schematic configuration of a liquid crystal display device 1a using a direct-type backlight according to the embodiment of the present invention.

As illustrated in FIG. 2, the liquid crystal display device 1a includes a liquid crystal panel 3 and lighting device 2a that is provided on the back of the liquid crystal panel 3 (side opposite to the image viewing side). The lighting device 2a is arranged as a backlight on the back side of and directly under the liquid crystal panel 3. That is, the liquid crystal display device 1a is a transmissive type display device and configured to emit a display light beam LO onto the display surface of the liquid crystal panel 2 using a white light beam WL from the lighting device 2a. The display light beam LO is made up of red, green and blue light beams $LO_r$, $LO_g$ and $LO_b$.

In the configuration of the lighting device 2a shown in FIG. 2, a plurality of LEDs 50 are arranged two-dimensionally on the bottom of the light source enclosure 52. Each of the LEDs 50 includes the three blue LEDs 50B and one red LED 50R as shown in the lighting device 2 of FIG. 1A. A diffusion layer 23 is arranged on top of the light source enclosure 52 to cover the same enclosure 52. The diffusion layer 23 includes a diffusion plate 16 and green phosphor layer 18. The diffusion plate 16 is formed on top of the green phosphor layer 18.

In the configuration shown in FIG. 2, the diffusion layer 23 may be arranged on top of a prism sheet 24, in which case a diffusion sheet 25 is not provided. Alternatively, the green phosphor layer 18 may be arranged under the prism sheet 24, in which case the diffusion layer 23 is not provided.

The white light beam WL is produced by a mixture of light beams of different colors, namely, red and blue light beams from the blue and red LEDs 50B and 50R of the lighting device 2a and a green light beam from the green phosphor layer 18 as a result of excitation with the blue light beam.

The diffusion sheets 23 and 25 are designed to diffuse the white light beam WL headed toward the liquid crystal panel 3, thus providing reduced uneven luminance. On the other hand, the prism sheet 24 is designed to direct the white light beam WL.

The liquid crystal panel 3 has a layered structure in which a multilayer film is provided between a pair of glass substrates 32A and 32B (glass substrate 32A on the side of the lighting device 2a and glass substrate 32B on the viewing side). The multilayer film includes, in sequence from the side of the lighting device 2a, transparent pixel electrodes 33, liquid crystal layer 34, transparent electrode 35, color filters 36 and black matrices 37. The transparent pixel electrodes 33 are provided one for each pixel. The transparent electrode 35 is provided as a common electrode for all the pixels. The color filters 36 are each associated with one of the pixels. The black matrices 37 are provided one between each two color filters 36. Further, polarizing plates 31A and 31B are formed respectively on the surfaces of the glass substrates 32A and 32B on the opposite side of the liquid crystal layer 34.

The polarizing plates 31A and 31B are a type of optical shutter and designed to pass only light oscillating in a certain direction (polarized light). The polarizing plates 31A and 31B are arranged so that the polarization axes thereof are 90 degrees apart from each other, thus allowing for the white light beam WL from the lighting device 2a to be transmitted or blocked via the liquid crystal layer 34.

The glass substrates 32A and 32B are generally transparent to visible light. Therefore, the same substrates 32A and 32B are not limited to glass substrates so long as they are transparent to visible light, but transparent resin substrates may also be used. It should be noted that drive circuits (not shown) are formed in the glass substrate 32A. These circuits include TFTs (Thin Film Transistors) and wirings. The TFTs are electrically connected to the transparent pixel electrodes 33 and function as drive elements.

The transparent pixel electrodes 33 are made, for example, of ITO (Indium Tin Oxide) and function as pixel electrodes of the pixels. The transparent electrode 35 is also made, for example, of ITO and functions as a common opposed electrode.

The liquid crystal layer 34 is made, for example, of TN (Twisted Nematic) or STN (Super Twisted Nematic) mode liquid crystal. The same layer 34 transmits or blocks the white light beam WL from the lighting device 2a using the pixels according to the voltage applied by the unshown drive circuits.

The black matrices 37 are provided one between each two color filters 36. The same matrices 37 block the white light beam WL from the lighting device 2a to prevent the same beam WL from being emitted to the viewing side of the liquid crystal panel 3.

The color filters 36 separate the white light beam WL from the lighting device 2a into three primary colors of red (R), green (G) and blue (B). The color filters 36 include red, green and blue color filters. The red, green and blue color filters selectively transmit light in the red, green and blue wavelength regions, respectively.

In the liquid crystal display device according to the present embodiment, the blue and red light beams from the blue and red LEDs 50B and 50R of the lighting device 2a are emitted to the green phosphor layer 18. A green light beam from the green phosphor layer 18 as a result of excitation with the blue light beam is mixed with the blue and red light beams and emitted to the diffusion plate 16. The mixture of the green, red and blue light beams produces the white light beam WL. The white light beam WL is reduced in uneven brightness by the diffusion sheet 23 and directed by the prism sheet 24.

The white light beam WL incident upon the liquid crystal panel 3 is modulated by the voltage applied between the transparent pixel electrodes 33 and transparent electrode 35 based on a video signal and separated by the color filters 36 associated with the respective colors. This causes the display light beam LO, made up of the red, green and blue light beams $LO_r$, $LO_g$ and $LO_b$, to be emitted onto the display surface on the viewing side of the liquid crystal panel 2, thus allowing a color image to be displayed.

In the liquid crystal display device according to the present embodiment, the voltage applied to the transparent pixel electrodes 33 making up the pixel section is controlled on and off by the drive elements (TFTs) that are electrically connected to the transparent pixel electrodes 33. The voltage applied to the transparent pixel electrodes 33 is turned on and off synchronously with the lighting and extinguishing of the blue and red LEDs 50B and 50R making up the liquid crystal display device 1a.

In the liquid crystal display device, an image display period and black display period are provided. The drive elements are turned on during the image display period. Black image data adapted to turn off the drive elements is inserted during the black display period. Black image data is inserted in part of a frame, namely, a single or plurality of scan lines. When the black image is displayed, the LED elements (blue and red LEDs) making up the lighting device 2a located at the positions associated with the black insertion region (region in which black image data is inserted is referred to as the "black insertion region") are turned off synchronously with the movement of the black insertion region.

That is, the blue and red light-emitting elements located at the positions associated with the region other than the black insertion region are turned on, whereas those located at the positions associated with the black insertion region are turned off. Such control achieves pseudo impulse display, thus providing enhanced moving image visibility and contributing to improved moving image characteristics and color quality for fast moving image display.

In the configuration shown in FIG. 2, the blue and red light beams respectively from the blue and red LEDs 50B and 50R fall upon the green phosphor layer 18 and diffusion plate 16 in this order. However, the light beams from the blue and red LEDs 50B and 50R may alternatively fall upon the diffusion plate 16 and green phosphor layer 18 in this order.

Still alternatively, the diffusion sheet 23 may not be used, and the green phosphor layer 18 may not be formed on the surface of the diffusion plate 16. Instead, the green phosphor layer 18 may be formed on the surface of the prism sheet 24, diffusion sheet 25 or polarizing plate 31A on the light incident side. Still alternatively, as light diffusion particles, resin fine particles such as PMMA (polymethyl methacrylate) particles or cross-linked polystyrene (PS) particles or a variety of publicly known fine particles made of inorganic materials may be kneaded and dispersed in a binder (binding agent) together with the green phosphor to form the green phosphor layer (light diffusion layer) 18 with enhanced light diffusion capability. This green phosphor layer 18 may be used as the diffusion plate 16 shown in FIG. 2, in which case the green phosphor layer 18 shown in FIG. 2 can be omitted.

Figure 3:
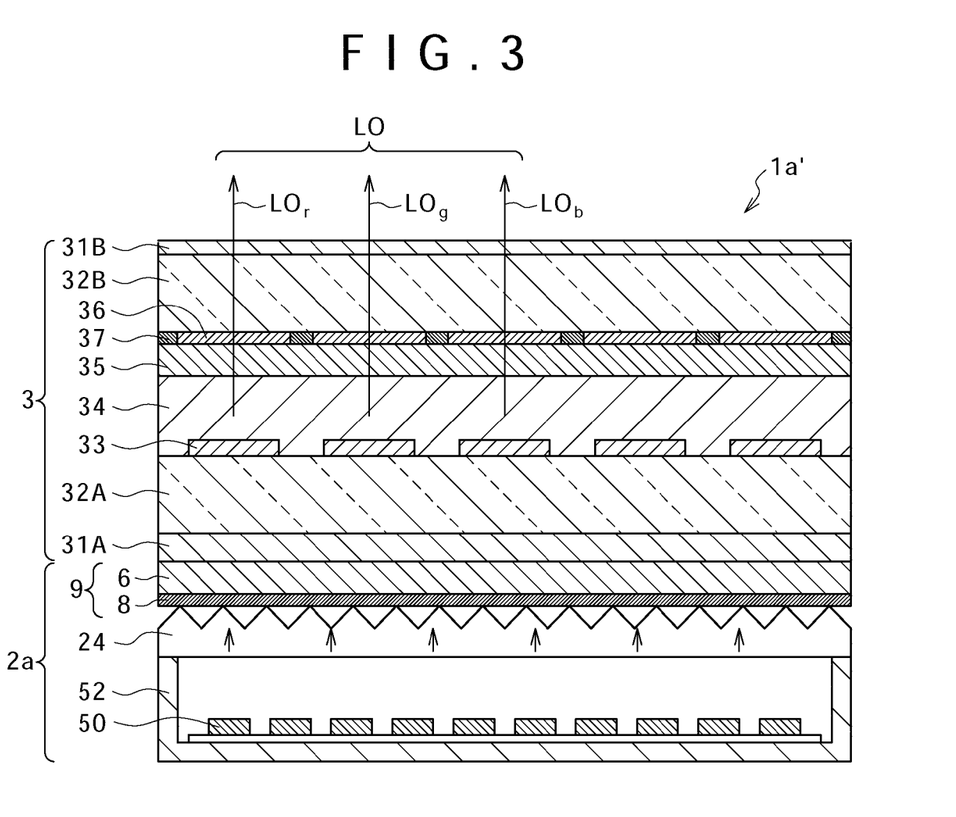
FIG. 3 is a cross-sectional view describing the schematic configuration of a liquid crystal display device using a direct-type backlight according to an embodiment.

FIG. 3 is a cross-sectional view describing the schematic configuration of a liquid crystal display device 1a' using a direct-type backlight according to the embodiment of the present invention.

In the configuration shown in FIG. 3, a diffusion film 9 is used rather than the diffusion layer (diffusion sheet) 23, shown in FIG. 2, having the green phosphor layer 18 formed on the surface of the diffusion plate 16. The diffusion film 9 has a green phosphor layer (light diffusion layer) 8 formed on a transparent support plate 6.

As illustrated in FIG. 3, the liquid crystal display device 1a' includes the liquid crystal panel 3 and lighting device 2a that is provided on the back of the liquid crystal panel 3 (side opposite to the image viewing side). The lighting device 2a is arranged as a backlight on the back side of and directly under the liquid crystal panel 3. That is, the liquid crystal display device 1a' is a transmissive type display device and configured to emit the display light beam LO onto the display surface of the liquid crystal panel 2 using the white light beam WL from the lighting device 2a. The display light beam LO is made up of the red, green and blue light beams $LO_r$, $LO_g$ and $LO_b$.

In the configuration of the lighting device 2a shown in FIG. 3, the plurality of LEDs 50 are arranged two-dimensionally on the bottom of the light source enclosure 52, as with the configuration shown in FIG. 2. Each of the LEDs 50 includes the three blue LEDs 50B and one red LED 50R. The prism sheet 24 is arranged on top of the light source enclosure 52 to cover the same enclosure 52. The diffusion film 9 is further arranged on top of the prism sheet 24. The diffusion film 9 includes the green phosphor layer (light diffusion layer) 8 formed on a transparent support substrate 6. It should be noted that the diffusion film 9 may be arranged under the prism sheet 24.

The blue and red light beams respectively from the blue and red LEDs 50B and 50R are mixed with the green light beam from the green phosphor layer (light diffusion layer) 8 as a result of excitation with the blue light beam, thus producing the white light beam WL.

The diffusion film (sheet) 9 is designed to diffuse the white light beam WL headed toward the liquid crystal panel 3, thus providing reduced uneven luminance. On the other hand, the prism sheet 24 is designed to direct the light beams from the blue and red LEDs 50B and 50R.

The configuration of the liquid crystal panel 3 in FIG. 3 is the same as that in FIG. 2, and the description thereof will be omitted.

In the liquid crystal display device according to the present embodiment, the light beams from the blue and red LEDs 50B and 50R are directed by the prism sheet 24 and emitted onto the green phosphor layer (light diffusion layer) 8. The green light beam from the green phosphor layer (light diffusion layer) 8 as a result of excitation with the blue light beam from the blue LEDs 50B is mixed with the blue and red light beams from the blue and red LEDs 50B and 50R, thus producing the white light beam WL with reduced uneven luminance.

In the configuration shown in FIG. 3, the light beams from the blue and red LEDs 50B and 50R fall upon the green phosphor layer (light diffusion layer) 8 and transparent support plate 6 in this order. However, the light beams from the blue and red LEDs 50B and 50R may alternatively fall upon the transparent support plate 6 and green phosphor layer (light diffusion layer) 8 in this order.

Alternatively, the diffusion film 9 may not be used, and the green phosphor layer (light diffusion layer) 8 may not be formed on the surface of the transparent support plate 6. Instead, the green phosphor layer (light diffusion layer) 8 may be formed on the surface of the polarizing plate 31A on the light incident side.

In the lighting device 2a described above, the green phosphor layer (light diffusion layer) 8 may include any of a variety of publicly known light diffusion agents. The same layer 8 may include, in addition to a green phosphor, resin fine particles such as PMMA (polymethyl methacrylate) particles or fine particles made of inorganic materials as light diffusion particles adapted to provide enhanced light diffusion capability. A variety of binders (binding agents) can be used to form the same layer 8.

APPLICATION EXAMPLE

A description will be given first of an application example in which the deterioration of a phosphor used in the lighting device was investigated.

Phosphor Deterioration Test

Nitride and oxynitride phosphors are considered highly reliable. Therefore, $(Sr,Ba)_2SiO_4$:Eu, a widely known oxide phosphor, and $SrGa_2S_4$:Eu, a widely known sulfide phosphor, were tested for reliability.

Figure 4:
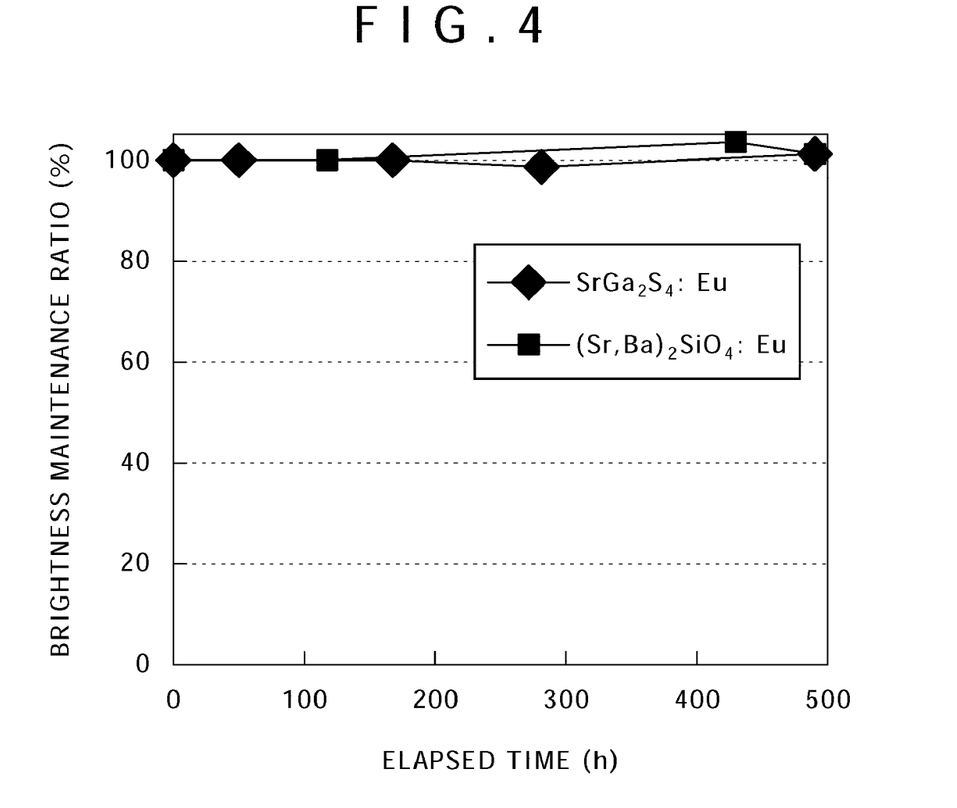
FIG. 4 is a diagram describing the results of a phosphor deterioration test in an application example according to an embodiment.

FIG. 4 is a diagram describing the results of a phosphor deterioration test in the application example of the present invention.

FIG. 4 illustrates, for the green phosphor placed in an environmental tester at a temperature of 60° C. and a humidity of 90%, the elapsed standing time during which the phosphor was left standing alone in the tester against the change over time in brightness of green fluorescence emitted by the green phosphor when the phosphor was taken out of the tester and excited with a blue light beam after each elapsed standing time. In FIG. 4, the horizontal axis represents the elapsed time, and the vertical axis the brightness maintaining ratio (%) standardized by the brightness when the elapsed time is 0.

It has been found as illustrated in FIG. 4 that $(Sr,Ba)_2SiO_4$:Eu and $SrGa_2S_4$:Eu show almost no decrease in brightness by themselves.

A description will be given next of a deterioration test of a lighting device manufactured by embedding an LED element with a resin having a green phosphor dispersed therein.

Phosphor Deterioration Test in Lighting Devices Using LED Element

Lighting devices were fabricated, one by potting a blue LED chip package with a transparent silicone resin having oxide phosphor $(Sr,Ba)_2SiO_4$:Eu kneaded therein and another by potting with the transparent silicone resin having sulfide phosphor $SrGa_2S_4$:Eu kneaded therein. A so-called side-emitter LED element was used. This type of LED element offers low brightness directly above the LED chip and high brightness on the sides of the LED chip with high radiation directivity. The LED element has a current rating of 20 mA.

Figure 5:
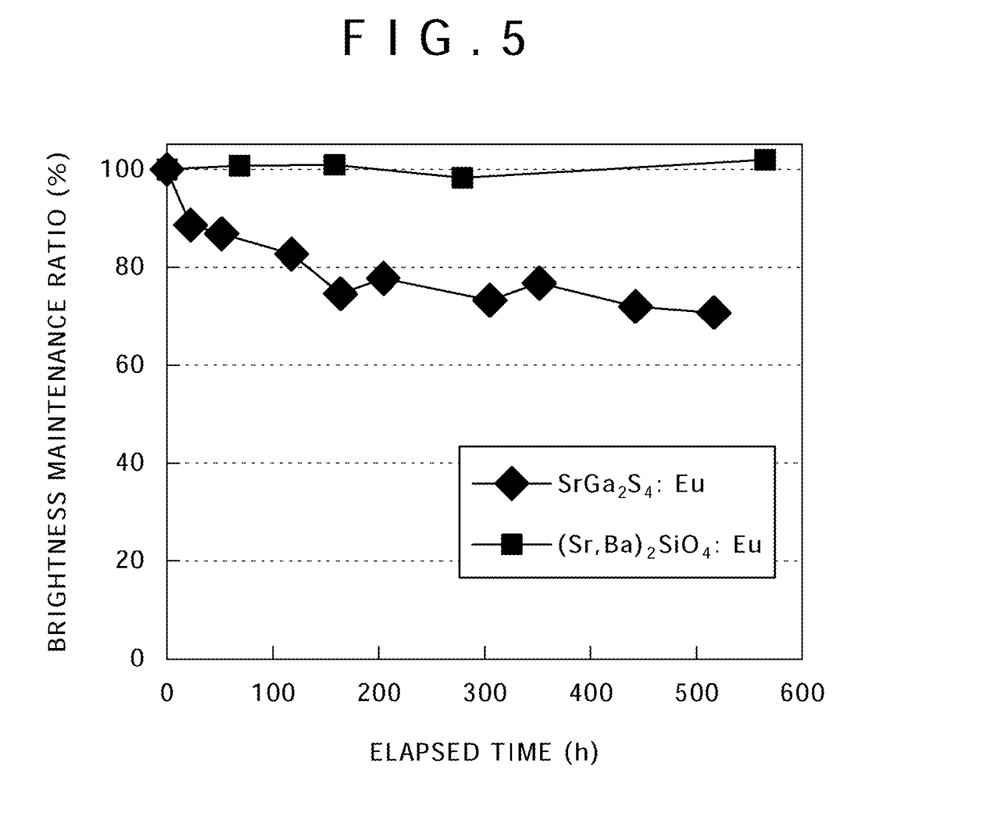
FIG. 5 is a diagram describing the results of a phosphor deterioration test in lighting devices in the application example according to an embodiment.

FIG. 5 is a diagram describing the results of a phosphor deterioration test in the lighting devices in the application example of the present embodiment.

FIG. 5 illustrates, for the lighting devices placed in an environmental tester at a temperature of 60° C. and a humidity of 90%, the elapsed standing time during which the lighting devices, each including an LED element embedded with a silicone resin having a green phosphor dispersed therein, were left standing alone in the tester against the change over time in brightness of green fluorescence emitted by the green phosphor when the lighting devices were taken out of the tester and the green phosphor was excited with a blue light beam after each elapsed standing time. In FIG. 5, the horizontal axis represents the elapsed time, and the vertical axis the brightness maintaining ratio (%) standardized by the brightness when the elapsed time is 0.

It has been found as illustrated in FIG. 5 that the oxide phosphor $(Sr,Ba)_2SiO_4$:Eu shows no change in brightness. However, the sulfide phosphor $SrGa_2S_4$:Eu which did not show any brightness deterioration when tested by itself shows brightness deterioration.

Cause of Brightness Deterioration of the Sulfide Phosphor

In order to investigate the brightness deterioration of the sulfide phosphor $SrGa_2S_4$:Eu, the cross-sectional image of the LED element was observed by cutting the lighting device.

Figure 6A:
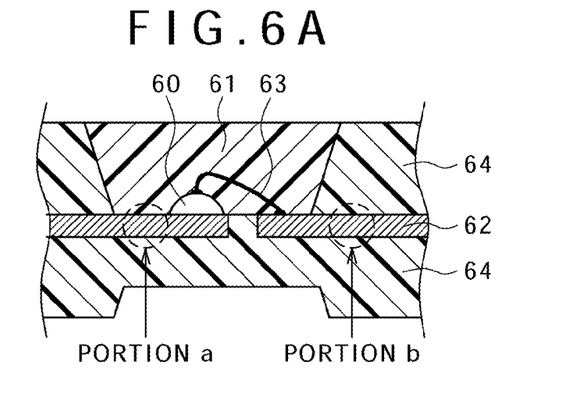
FIGS. 6A to 6C are views describing the deterioration of a lighting device using an LED element in the application example according to the embodiment of the present invention.
Figure 6B:
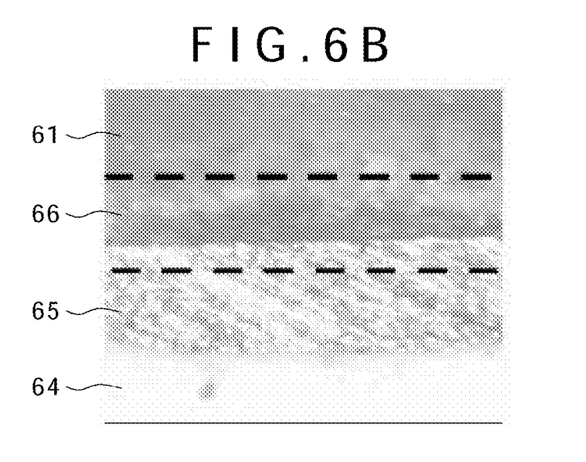
Figure 6C:
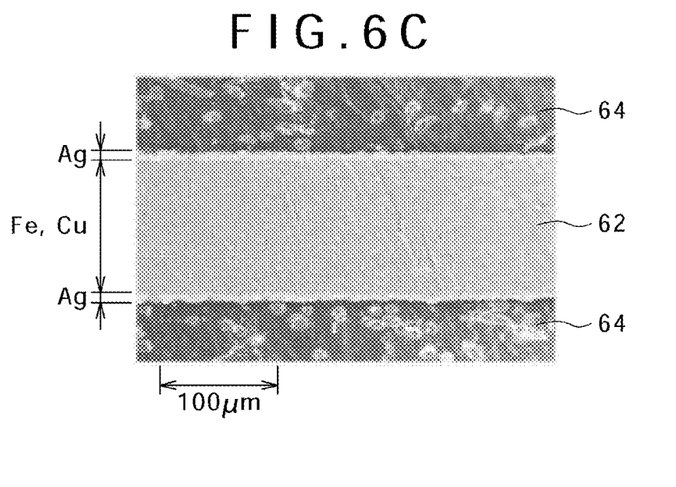

FIGS. 6A to 6C are views describing the deterioration of a lighting device using an LED element in the application example of the present invention.

FIG. 6A is a cross-sectional view illustrating part of the cross-section including the LED element in the lighting device. The lighting device includes the LED element embedded with a resin in which a green phosphor is dispersed. FIG. 6B is an optical image (350× magnification) of a portion 'a' shown in FIG. 6A. FIG. 6C is a scanning electron microscope image of a portion 'b' shown in FIG. 6A.

As illustrated in FIG. 6A, a side-emitter LED element 60 is bonded on a lead frame 62 by wire bonding 63. Further, a package resin 64 is provided around the LED element 60. Inorganic particles are dispersed in the package resin 64 to achieve a higher refractive index. The LED element 60 is embedded with a transparent silicone resin having a green phosphor dispersed therein.

As illustrated in FIG. 6B, a blackened portion 66 has emerged in the electrode area of the lead frame 62. The same portion 66 was considered attributable to the phosphor deterioration. In LED packages, an Ag thin film is often used as a reflecting plate, and Ag paste as an adhesive. The diffused Ag reacts with sulfur atoms of the sulfide phosphor to produce silver sulfide, thus deteriorating the phosphor.

FIG. 6C illustrates a scanning electron microscope image of the cross-section of the lead frame 62 together with element analysis results by energy dispersive X-ray spectroscopy. The presence of Ag thin films can be observed on the electrode of the lead frame 62. The electrode is made of a material containing Cu and Fe. It was confirmed that the Ag thin films were used both as electrodes and reflecting plates, and found that the blackened portion 66 was attributable to the production of Ag sulfide.

Although some commercially available LEDs do not contain Ag, it is preferred to be able to achieve a highly reliable lighting device and display device having the same, including a backlight and a liquid crystal television having the same, without depending on the LED supplier and LED structure and configuration. A lighting device such as backlight system which can accommodate LEDs of arbitrary structure and configuration is extremely useful.

A description will be given next of an application example in which the characteristic deterioration of the lighting device based on the embodiment of the present invention described earlier was investigated.

Lighting Device Structure

As an example of lighting device structure having a green phosphor provided apart from the LED package, a lighting device of simple configuration was fabricated using four LED elements as illustrated in FIG. 1 to investigate the brightness deterioration. The lighting device uses a green phosphor sheet fabricated by coating a resin sheet only with a green phosphor. The lighting device was fabricated as described below.

The sulfide phosphor $SrGa_2S_4$:Eu that showed significant deterioration as illustrated in FIG. 5 was used as the phosphor. A resin was prepared by dissolving 30 g of ethyl cellulose (first class grade, Kanto Chemical, 100 cp) in butyl acetate (first class grade, Kanto Chemical). This resin and phosphor $SrGa_2S_4$:Eu were mixed and dispersed at a weight ratio of 100:40. Then, the mixture was applied to a PET sheet of 188 μm thick by a printing method to prepare a green phosphor sheet 53 of 10 μm thick. It should be noted that a silicone resin, epoxy resin or urethane resin, for example, may also be used as a resin in which a phosphor is dispersed.

Three blue LEDs (LUMILEDS LXK2-PR12-M00 by LUMILEDS) and one red LED (LUMILEDS LXK2-PD12-Q00 by LUMILEDS) both using Ag were used as LEDs. These LEDs are side-emitter LEDs. Both the blue and red LEDs have a current rating of 350 mA.

As described above, the lighting device 2 as illustrated in FIG. 1 was fabricated. The same device 2 includes the blue LEDs 50B adapted to emit a blue light beam, the red LED 50R adapted to emit a red light beam and the green phosphor sheet 53 having a green phosphor layer formed on a resin sheet. In the same device 2, the green phosphor layer is excited with the blue light beam to emit a green light beam, which is then mixed with the blue and red light beams to emit a white light beam.

A description will be given next of a characteristic deterioration test of a lighting device.

Deterioration Test of Lighting Device

Figure 7:
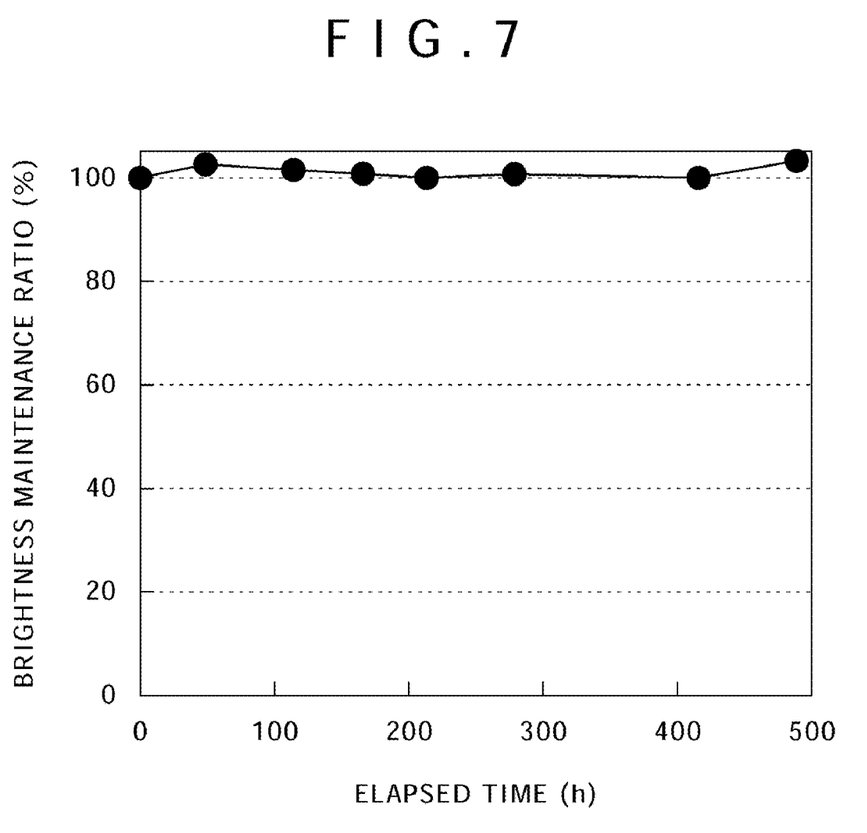
FIG. 7 is a diagram describing the results of a deterioration test of a lighting device in the application example according to an embodiment.

FIG. 7 is a diagram describing the results of a deterioration test of a lighting device in the application example of the present invention.

FIG. 7 illustrates, for a lighting device having blue LED elements and a green phosphor layer provided apart from each other placed in an environmental tester at a temperature of 60° C. and a humidity of 90%, the elapsed standing time during which the lighting device was left standing in the tester against the change over time in brightness of green fluorescence emitted by the green phosphor when the lighting device was taken out of the tester and the green phosphor was excited with a blue light beam after each elapsed standing time. In FIG. 7, the horizontal axis represents the elapsed time, and the vertical axis the brightness maintaining ratio (%) standardized by the brightness when the elapsed time is 0.

As illustrated in FIG. 7, the phosphor did not show any brightness deterioration unlike the results shown in FIG. 5. Further, for purposes of confirmation, a phosphor sheet was fabricated using $(Sr,Ba)_2SiO_4$:Eu (refractive index of this phosphor is 1.628) and subjected to the same deterioration test as described above. As a result, it was found that although the blue LEDs use Ag as with the above-described lighting device, the phosphor sheet did not show any brightness deterioration.

As described above, when the LED elements and green phosphor layer are provided apart from each other, it is possible to achieve a lighting device offering similar performance to non-sulfide phosphors free from brightness deterioration even when a sulfide phosphor is used. Such a configuration having the phosphor and LEDs provided apart from each other provides a lighting device using arbitrary LEDs irrespective of the configuration and structure thereof and using not only sulfide phosphors but also arbitrary types of phosphors.

A description will be given next of the comparison results between white lighting devices having different configurations.

A lighting device having the same configuration as that used to obtain the deterioration test results shown in FIG. 7 will be hereinafter referred to as a single-phosphor-sheet bicolor-LED-excitation lighting device. This lighting device includes a green phosphor sheet made of the sulfide phosphor $SrGa_2S_4$:Eu, three blue LEDs and one red LED.

A white lighting device which includes one blue LED adapted to emit a blue light beam, two green LEDs adapted to emit a green light beam and one red LED adapted to emit a red light beam will be hereinafter abbreviated as a tricolor LED lighting device and referred to as Comparative Example 1. In this lighting device, the blue, green and red light beams are mixed together to emit a white light beam.

A lighting device which includes blue LEDs adapted to emit a blue light beam, and green and red phosphor layers will be hereinafter abbreviated as a double-phosphor-sheet unicolor-LED-excitation lighting device and referred to as Comparative Example 2. In this lighting device, green and red light beams are emitted respectively by exciting the green and red phosphor layers with a blue light beam, and the blue, green and red light beams are mixed together to emit a white light beam.

Single-Phosphor-Sheet Bicolor-LED-Excitation Lighting Device

This single-phosphor-sheet bicolor-LED-excitation lighting device has the same configuration as that used to obtain the deterioration test results shown in FIG. 7. The lighting device uses a green phosphor sheet made of the sulfide phosphor $SrGa_2S_4$:Eu, three blue LEDs and one red LED. Therefore, the description thereof will be omitted.

Tricolor LED Lighting Device

Comparative Example 1

Figure 8A:
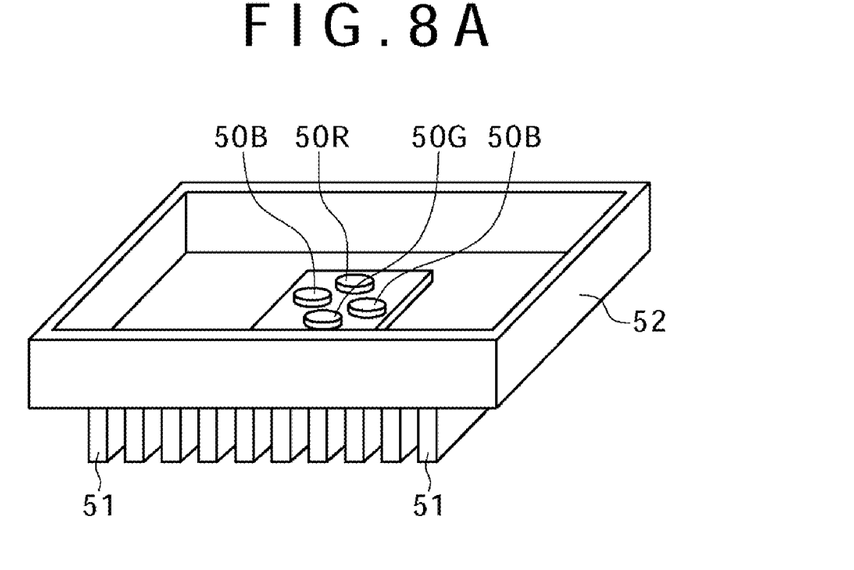
FIGS. 8A and 8B are perspective views describing the schematic configuration of a lighting device in a comparative example.
Figure 8B:
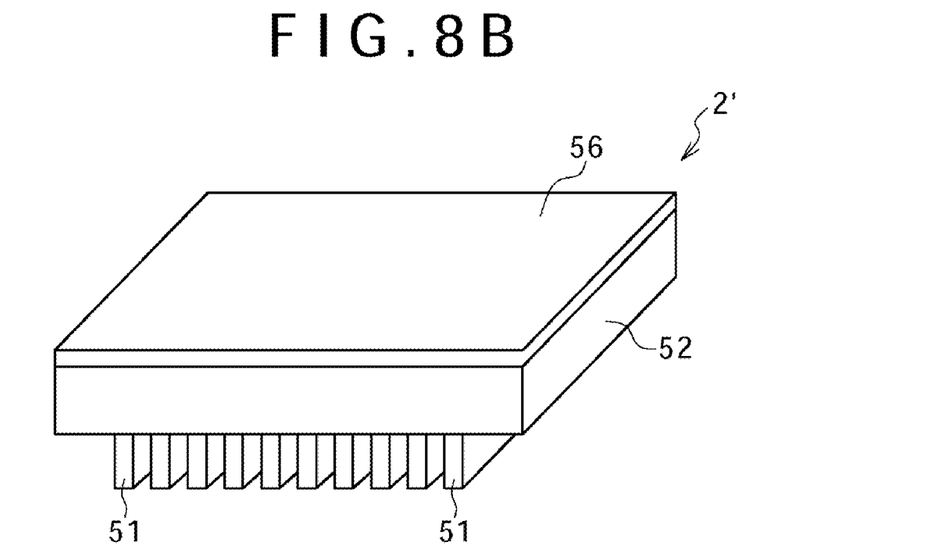

FIGS. 8A and 8B are perspective views describing the schematic configuration of a tricolor LED lighting device in a comparative example. FIG. 8A is a perspective view illustrating the internal schematic configuration of the lighting device.

FIG. 8B is a perspective view illustrating the appearance thereof.

As illustrated in FIGS. 8A and 8B, a tricolor LED lighting device 2' includes four LEDs and a diffusion plate 56. The SUMIPEX E RM800 by Sumitomo Chemical was used as the diffusion plate 56. The one blue LED 50B (LUMILEDS LXK2-PR12-M00 by LUMILEDS), two green LEDs 50G (LUMILEDS LXK2-PM12-R00 by LUMILEDS) and one red LED (LUMILEDS LXK2-PD12-Q00 by LUMILEDS)

were used as the LEDs. The red LED 50R has a current rating of 350 mA and a chromaticity of (0.703, 0.294).

Double-Phosphor-Sheet Unicolor-LED-Excitation Lighting Device

Comparative Example 2

This double-phosphor-sheet unicolor-LED-excitation lighting device does not have the red LED 50R used in the lighting device shown in FIG. 1. Instead, the lighting device includes a PET sheet printed with a mixture of a red phosphor made of the sulfide phosphor CaS:Eu and another sulfide phosphor $SrGa_2S_4$:Eu at a weight ratio of 20:80. The sulfide phosphor CaS:Eu offers an extremely high internal quantum efficiency of 81% and a high color purity. In FIG. 1, all the four LEDs are blue LEDs.

Comparing the power consumption required to achieve the same brightness, it was found that the power consumption of the single-phosphor-sheet bicolor-LED-excitation lighting device was 70% of that of the tricolor LED lighting device (Comparative Example 1). Although the emission efficiency of the tricolor LED lighting device (Comparative Example 1) was 46 (lm (lumen)/W), that of the single-phosphor-sheet bicolor-LED-excitation lighting device was 72 (lm (lumen)/W). This difference in emission efficiency is attributable to the difference in emission efficiency between the green LED and green phosphor using blue LEDs. On the other hand, the power consumption of the double-phosphor-sheet unicolor-LED-excitation lighting device was 51% of the single-phosphor-sheet bicolor-LED-excitation lighting device. This is attributable to the difference in efficiency between the red LED and red light emission by exciting the red phosphor with blue LEDs. The following describes this difference.

In the tricolor LED lighting device (Comparative Example 1), the emission efficiency of the red LED was 35.8 (lm/W). Further, the red phosphor sheet used was about 34 μm in thickness. This was done for purposes of comparison to ensure that the blue light beams from the blue LEDs are mostly absorbed by the red phosphor sheet and do not pass through the sheet. This red phosphor sheet was excited by the blue LEDs to measure the red light emission efficiency. It was found that the emission efficiency was 6.59 (lm/W), and the chromaticity (0.704, 0.296).

From the above, at the same chromaticity point (0.70, 0.3), the red LED offers significantly higher emission efficiency than can be attained by red light emission by exciting the red phosphor with blue LEDs. This makes it clear that it is important to use only a green phosphor layer as a phosphor layer in the double-phosphor-sheet unicolor-LED-excitation lighting device (Comparative Example 2) using a red phosphor because of significant reduction in emission efficiency of white light as a whole. This is the reason why only a green phosphor layer is used as a phosphor layer in the embodiment of the present invention.

It should be noted that, in the lighting device according to the embodiment of the present invention, the green phosphor layer is not limited to that formed as the green phosphor sheet 53. The green phosphor layer need only be provided apart from the blue and red LED packages. Therefore, if, for example, a television set is considered as a display device, a phosphor layer may be formed by coating the rear surface of the liquid crystal panel with a green phosphor. Even in this case, light is diffused thanks to a high refractive index of the green phosphor.

As described above, the embodiment of the present invention achieves a highly reliable and highly efficient lighting device and a display device having the same even if blue LED chips of arbitrary configuration and structure and an arbitrary phosphor are used.

Although the preferred embodiment of the present invention has been described above, the present invention is not limited to the above embodiment or application example, but may be modified in various ways based on the technical concept of the invention.

As described above, the embodiment of the present invention provides a highly reliable and highly efficient lighting device even if blue LED chips of arbitrary configuration and structure and an arbitrary phosphor are used.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A lighting device comprising:
   a blue light-emitting element adapted to emit a blue light beam; and
   a green phosphor layer which is disposed apart from the blue light-emitting element and capable of functioning as a light diffusion layer, the green phosphor layer including
   a green phosphor adapted to emit green fluorescence when excited by the blue light beam, the green phosphor having a refractive index of 1.49 or more and a quantum efficiency of 79% or more.

2. The lighting device of claim 1, wherein
   the green phosphor layer is formed on the surface of a transparent support plate or light diffusion plate.

3. The lighting device of claim 1 comprising:
   a red light-emitting element arranged side by side with the blue light-emitting element and adapted to emit a red light beam, wherein
   the blue, green and red light beams are mixed together to emit a white light beam.

4. The lighting device of claim 3, wherein the green phosphor layer is provided above the blue light-emitting element.

5. The lighting device of claim 3, wherein the blue and red light-emitting elements are light-emitting diodes.

6. The lighting device of claim 3, wherein the green phosphor is composed of $SrGa_2S_4$:Eu or $(Sr,Ba)_2SiO_4$.

7. A display device having a lighting device as a backlight, the lighting device including
   a blue light-emitting element adapted to emit a blue light beam, and
   a green phosphor layer which is disposed apart from the blue light-emitting element and capable of functioning as a light diffusion layer, the green phosphor layer including
   a green phosphor adapted to emit green fluorescence when excited by the blue light beam, the green phosphor having a refractive index of 1.49 or more and a quantum efficiency of 79% or more.

8. The display device of claim 7, wherein the green phosphor layer is provided on the light emission side of the backlight or light incident side of a display panel.

9. The display device of claim 8, wherein the display panel is a liquid crystal panel.

10. The display device of claim 7 comprising:
    a pixel section which turns on and off synchronously with the lighting and extinguishing of the backlight.

* * * * *